(12) United States Patent  
Teramoto et al.

(10) Patent No.: US 7,675,347 B2  
(45) Date of Patent: Mar. 9, 2010

(54) SEMICONDUCTOR DEVICE OPERATING IN AN ACTIVE MODE AND A STANDBY MODE

(75) Inventors: Kazuhiro Teramoto, Tokyo (JP); Yoji Idei, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 150 days.

(21) Appl. No.: 11/984,464

(22) Filed: Nov. 19, 2007

(65) Prior Publication Data

US 2008/0116956 A1    May 22, 2008

(30) Foreign Application Priority Data

Nov. 20, 2006  (JP) .............................. 2006-313078

(51) Int. Cl.  
*H03K 3/01*     (2006.01)
(52) U.S. Cl. .................................... 327/534
(58) Field of Classification Search ................ 327/530, 327/534, 535  
See application file for complete search history.

(56) References Cited

U.S. PATENT DOCUMENTS

| 5,448,198 | A  | * | 9/1995  | Toyoshima et al. ......... 327/530 |
| 6,194,915 | B1 | * | 2/2001  | Nakayama et al. .......... 326/121 |
| 6,310,487 | B1 |   | 10/2001 | Yokomizo |
| 6,333,571 | B1 | * | 12/2001 | Teraoka et al. .............. 307/125 |
| 6,380,798 | B1 |   | 4/2002  | Mizuno et al. |
| 6,476,633 | B2 |   | 11/2002 | Yokomizo |
| 6,559,708 | B2 | * | 5/2003  | Notani ....................... 327/537 |
| 6,617,873 | B2 |   | 9/2003  | Yokomizo |
| 6,630,857 | B2 |   | 10/2003 | Mizuno et al. |
| 6,833,750 | B2 | * | 12/2004 | Miyazaki et al. ............ 327/534 |
| 7,123,076 | B2 | * | 10/2006 | Hatakeyama et al. ....... 327/534 |
| 2004/0012397 | A1 |   | 1/2004 | Mizuno et al. |

FOREIGN PATENT DOCUMENTS

| JP | 06-334010     | 12/1994 |
| JP | 2000-183180 A | 6/2000  |
| JP | 2000-357962 A | 12/2000 |

* cited by examiner

*Primary Examiner*—Jeffrey S Zweizig  
(74) *Attorney, Agent, or Firm*—Foley & Lardner LLP

(57) ABSTRACT

A semiconductor device operates in an active mode or a standby mode, and includes a substrate-potential power source line supplying a substrate potential which is higher in a standby mode than in an active mode, and a source-potential power source line supplying a source potential which is lower in a standby mode than in an active mode. During a mode shift from the standby mode to the active mode, a potential equalizing transistor is turned ON to pass a current flowing from the substrate-potential power source line to the source-potential power source line, to reduce the time length needed for shifting from the standby mode to the active mode.

14 Claims, 10 Drawing Sheets

SEMICONDUCTOR DEVICE OPERATING IN AN ACTIVE MODE AND A STANDBY MODE

This application is based upon and claims the benefit of priority from Japanese patent application No. 2006-313078, the disclosure of which is incorporated herein in its entirety by reference.

BACKGROUND OF THE INVENTION (a) Field of the Invention

The present invention relates to a semiconductor device operating in an active mode and a standby mode and, more particularly, to a semiconductor device capable of shifting from the standby mode to the active mode at a higher speed.

(b) Description of the Related Art

Some semiconductor devices operate in an active mode (normal operation mode) and a standby mode. The standby mode reduces the power dissipation of the semiconductor device, whereas the active mode allows transistors installed in the semiconductor device to operate with a designed performance. The switching between the active mode and the standby mode may be achieved by controlling the substrate potential (Vb) of the transistors. However, it is known in this technique that, if only the substrate potential Vb is raised in the transistors having a reduced device size, a leakage current referred to as gate-induced-drain leakage current may flow to thereby increase the power dissipation in the standby mode. Patent Publication JP-2000-357962A describes a technique for solving the above problem.

FIG. 9 shows the configuration of the semiconductor device described in JP-2000-357962A. The semiconductor device 200 includes transistors P201, P202, N201 and N202, referred to as target transistors hereinafter, for which the substrate potential and source potential are controlled, substrate-potential generation circuits 211 and 214, and source-potential generation circuits 212 and 213. The substrate-potential generation circuits 211 and 214 generate a potential to be supplied to power source lines 221 and 224, whereas the source-potential generation circuits 212 and 213 generate a potential to be supplied to power source lines 222 and 223. In this text, the N and P attached to the reference numeral of the transistors means the conductivity type of the transistors, indicating n-channel transistor and p-channel transistor, respectively.

The source (source region) of target transistors P201, P202, N201 and N202 is connected to a power source line 222 or 223. The well or substrate of target transistors P201, P202, N201, and N202 is connected to power source line 221 or 224. Target transistors P201 and N201 as well as target transistors P202 and N202, for which the substrate potential is to be controlled, configure an inverter, for example, which outputs a signal based on the signal input to the gate electrode.

The semiconductor device 200 allows the inverter to operate in the active mode by using the power source supplied between a high-potential(-side) power source VPERI supplied to internal power source lines 221 and 222 and a low-potential-side power source VSS supplied to internal power source lines 223 and 224. The internal power source VPERI is obtained by lowering the potential of the external high-potential power source VDD. Since the threshold voltage (Vt) of the transistors configuring the inverter is set at as low as 0.2V, for example, the transistors may have a sub-threshold leakage current flowing therethrough even when the input signal Vg supplied to the inverters is fixed at the ground level, i.e., VSS level, in the standby mode. In addition, a small leakage current flows through the target transistors in a standby state due to the floating potential of the power source line (VSS) or gate electrode, generation of noise, and influence by the range of variation in the threshold voltage caused by a manufacturing process, etc. In particular, an increase of the operating current caused by the leakage current incurs a problem especially in a large-scale semiconductor device.

In order to reduce the above leakage current in the standby mode of the semiconductor device, substrate-potential generation circuit 211 provides a substrate potential to target transistors P201 and P202, which is higher than the substrate potential VPERI provided in the active mode, whereas source-potential generation circuit 212 provides a source potential to target transistors P201 and P202, which is lower than the source potential VPERI in the active mode. In addition, in the standby mode, substrate-potential generation circuit 214 provides a substrate potential to target transistors N201 and N202, which is lower than the substrate potential VSS provided in the active mode, whereas source-potential generation circuit 213 provides a source potential to target transistors N201 and N202, which is lower than the source potential VSS provided in the active mode. Due to the above configuration, the gate potential with respect to the source potential of the target transistors allows the target transistors to shift in a direction toward a turn-OFF state thereof, and the substrate potential acts to increase the threshold voltage of the transistors, whereby the leakage current, which may otherwise flow due to the gate potential slightly exceeding the threshold voltage, as well as the sub-threshold leakage current can be suppressed, to thereby reduce the power dissipation.

FIG. 10 is a waveform diagram showing the potential of the power source lines 221-224. In the active mode, substrate-potential generation circuit 211 and source-potential generation circuit 212 both for the p-channel transistors output internal power source potential VPERI generated by lowering the potential of the external power source, whereby the potential Vbp, Vsp of power source line 221, 222 is VPERI. Source-potential generation circuit 213 and substrate-potential generation circuit 214 both for the n-channel transistors output an internal low-potential power source potential VSS, whereby the potential Vsn, Vbn of power source line 223, 224 is VSS. In the active mode, target transistors P201, P202, N201 and N202 operate on the power source (VPERI, VSS) generated by the source-potential generation circuit 212, 213.

During a mode shift from the active mode to the standby mode, substrate-potential generation circuit 211 for the p-channel transistors raises the potential supplied to power source line 221 from a VPERI level by ΔVbn, whereas substrate-potential generation circuit 214 for the n-channel transistors lowers the potential supplied to power source line 224 from a VSS level by ΔVsp. At the same time, substrate-potential generation circuit 212 for the p-channel transistors lowers the potential supplied to power source line 222 from a VPERI level by ΔVbn, whereas substrate-potential generation circuit 213 for the n-channel transistors raises the potential supplied to power source line 223 from VSS level by ΔVsn. Due to the potential modification as described above, the gate potential with respect to the source potential of the target transistors is controlled to allow the target transistors to shift in a direction toward a turn-OFF state thereof, whereby the leakage current of the target transistors is reduced in addition to the reduction due to the shift of the substrate potential.

During a mode shift from the standby mode to the active mode, substrate-potential generation circuit 211 and source-potential generation circuit 212 both for the p-channel transistors return the potential of power source lines 221 and 222 from Vbp, Vsp to a VPERI level, whereas source-potential generation circuit 213 and substrate-potential generation circuit 214 both for n-channel transistors return the potential of power source lines 223 and 224 from Vsn, Vbn to a VSS level. Since the potential output from substrate-potential generation circuit 211 and source-potential generation circuit 212 assumes a VPERI level, the potential Vbp of power source line 221 gradually falls toward VPERI and the potential Vsp of power source line 222 gradually rises toward the VPERI level. In addition, since the potential output from source-potential generation circuit 213 and substrate-potential generation circuit 214 assumes a VSS level, the potential Vsn of power source line 223 gradually falls toward the VSS level and the potential Vbn of power source line 224 gradually rises toward the VSS level. Thus, when the potential Vbp, Vsp of power source lines 221 and 222 assume the VPERI level, and the potential Vsn, Vbn of power source lines 223 and 224 assumes the VSS level, an active mode is restarted.

In the above semiconductor device 200, there is a problem in that the speed at which the potential of power source lines 221 and 222, i.e., the substrate potential and source potential of p-channel target transistors returns to the VPERI level is low during the mode shift from the standby mode to the active mode. Similarly, the speed at which the potential of power source lines 223 and 224, i.e., the source potential and substrate potential of the n-channel target transistors returns to the VSS level is low. In addition, since substrate-potential generation circuits 211 and 214 and source-potential generation circuits 212 and 213 are provided as separate power source circuits, the relationship between the source potential and the substrate potential of the transistors may cause a forward current across the p-n junction during the transient state of the power source potentials, thereby incurring a latch up failure. Further, since power source lines 222 and 223 for providing the source potential is scarcely involved with parasitic well capacitance, a compensating capacitor may be needed to power source lines 222 and 223 for enhancing the source power, which may increase the circuit scale.

SUMMARY OF THE INVENTION

In view of the above problems, it is an object of the present invention to provide a semiconductor device operating in an active mode and a standby mode, wherein the source potential and substrate potential are controlled between these modes, and wherein the speed of the mode shift from the standby mode to the active mode can be accelerated.

The present invention provides a semiconductor device including: a target transistor operating in either an active mode and a standby mode; a substrate-potential power source line and a source-potential power source line for providing a substrate potential and a source potential, respectively, to the target transistor; and a potential equalizing transistor for controlling coupling between the substrate-potential power source line and the source-potential power source line, wherein: the potential equalizing transistor is OFF, and different potentials are supplied to the substrate-potential power source line and the source-potential power source line in the standby mode; the potential equalizing transistor is turned ON during a mode shift from the standby mode to the active mode; and a common potential is supplied to the substrate-potential power source line and the source-potential power source line in the active mode.

The above and other objects, features and advantages of the present invention will be more apparent from the following description, referring to the accompanying drawings.

PREFERRED EMBODIMENT OF THE INVENTION

Figure 1:
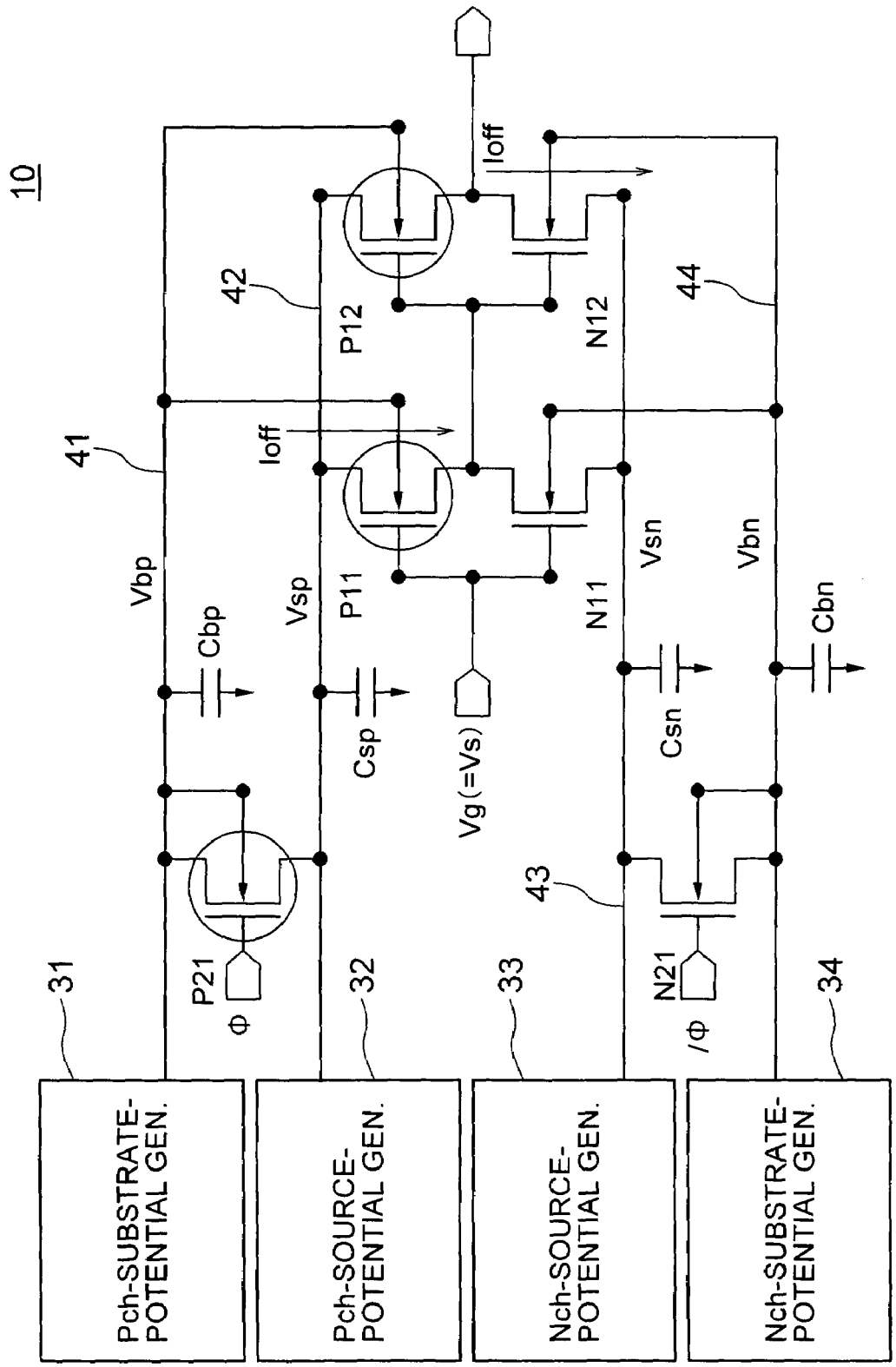
FIG. 1 is a circuit diagram of a semiconductor device according to a first embodiment of the present invention.

Now, exemplary embodiments of the present invention will be described with reference to accompanying drawings, wherein similar constituent elements are designated by similar reference numerals. FIG. 1 shows a semiconductor device according to a first embodiment of the present invention. The semiconductor device, generally designated by numeral 10, includes target transistors P11, P12, N11 and N12, for which substrate potential and source potential are to be controlled, potential equalizing transistors P21 and N21, substrate-potential generation circuits 31 and 34, and source-potential generation circuits 32 and 33. The substrate-potential generation circuits 31 and 34 generate potential to be supplied to power source lines 41 and 44, respectively. The source-potential generation circuits 32 and 33 generate potentials to be supplied to power source lines 42 and 43, respectively. In FIG. 1, although potential equalizing transistors P21, N21 are exemplified, these transistors may be provided for each of a plurality of circuit blocks in the semiconductor device 10.

The source of target transistors P11 and P12 is connected to power source line 42. The source of target transistors N11 and N12 is connected to power source line 43. The drain of target transistors P11 and P12 is connected to the drain of target transistors N11 and N12, respectively. Target transistors P11 and N11 as well as target transistors P12 and N12 in combination configure an inverter. The gate of target transistors P11 and N11 is connected to a signal input terminal, whereas the gate of target transistors P12 and N12 is connected the drain of target transistors P11 and N11, respectively. The substrate of target transistors P11 and P12 is connected to power source line 41, whereas the substrate of target transistors N11 and N12 is connected to power source line 44.

The substrate-potential generation circuits 31 and 34 and source-potential generation circuits 32 and 33 each deliver a predetermined potential, such as VPERI and VSS in a normal operation (or active mode) of the semiconductor device 10. In addition, substrate-potential generation circuit (Pch-substrate-potential generation circuit) 31 providing a high-potential source voltage delivers a potential which is ΔVbp higher than potential VPERI in the active mode. In the standby mode, source-potential generation circuit (Pch-source-potential generation circuit) 32 delivers a potential which is ΔVsp lower than potential VPERI used in the active mode. In the standby mode, source-potential generation circuit (Nch source-potential generation circuit) 33 generating a low-potential source voltage delivers a potential which is ΔVsn higher than potential VSS, and substrate-potential generation circuit (Nch-substrate-potential generation circuit) 34 delivers a potential which is ΔVbn lower than potential VSS used in the active mode.

The potential-equalizing transistors P21 and N21 control coupling between power source line 41 and power source line 42 and between power source line 43 and power source line 44, respectively. The potential equalizing transistors P21 and N21 are controlled by a control signal φ or an inverted control signal /φ. These control signals φ and /φ are controlled to shift the potential thereof from a H-level to a L-level or from a L-level to a H-level during the mode shift between the active mode and the standby mode.

Figure 2:
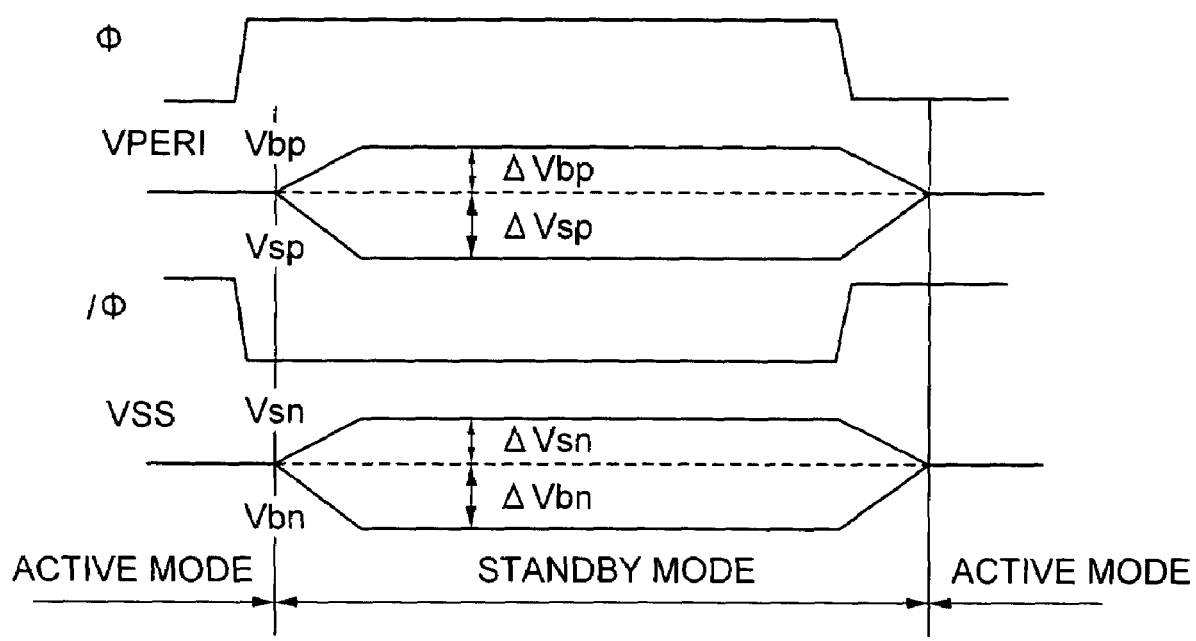
FIG. 2 is a timing chart showing the potential of power source lines and signal in the semiconductor device of FIG. 1.

FIG. 2 is a timing chart showing the potential of power source lines and signal φ in the semiconductor device 10 of FIG. 1. When the semiconductor device 10 is in an active mode, a high-potential source voltage VPERI is supplied to power source lines 41 and 42 from Pch-substrate-potential generation circuit 31 and Pch-source-potential generation circuit 32, respectively. In addition, a low-potential source voltage VSS is supplied to power source lines 43 and 44 from Nch-source-potential generation circuit 33 and Nch-substrate-potential generation circuit 34. At this stage, signal (control signal) φ is controlled to assume a L-level, whereby potential equalizing transistors P21 and N21 are ON, power source lines 41 and 42 assuming a VPERI level are coupled together, and power source lines 43 and 44 assuming a VSS level are coupled together.

Control signal φ is controlled to shift the potential thereof from a L-level to a H-level during a mode shift of the semiconductor device 10 from an active mode to a standby mode. This allows the potential equalizing transistor P21 and N21 to turn OFF, whereby power source line 41 and power source line 42 as well as power source line 43 and power source line 44 are isolated from each other. At this stage, source-potential generation circuit 31 raises the potential Vbp of power source line 41 by ΔVbp from a VPERI level, and Pch-source-potential generation circuit 32 lowers the potential Vsp of power source line 42 by ΔVsp from a VPERI level. Accordingly, the source potential of transistors P11 and P12 assumes VPERI−ΔVsp, and the substrate potential thereof assumes VPERI+Δbp. In addition, Nch-substrate-potential generation circuit 34 lowers the potential Vbn of power source line 44 by ΔVbn from a VSS level, and Nch-source-potential generation circuit 33 raises the potential Vsn of power source line 43 by ΔVsn from a VSS level. Thus, the source potential of target transistors N11 and N12 assumes VSS+ΔVsn, and the substrate potential thereof assumes VSS−ΔVbn.

In the operation of the semiconductor device 10, the source potential of target transistors P11 and P12 is lowered by ΔVsp from potential VPERI used in the active mode, and the substrate potential thereof is raised by ΔVbp from potential VPERI. This allows the gate potential with respect to the source potential of target transistors P11 and P12 to shift in a direction toward a turn-OFF state thereof, and also increases the threshold voltage of these transistors due to the substrate effect, whereby the leakage current of target transistors P11 and P12 is reduced. Similarly, the source potential of target transistors N11 and N12 is raised by ΔVsn from potential VSS used in the active mode, and the substrate potential thereof is reduced by ΔVbn from potential VSS. This allows the gate potential with respect to the source potential of target transistors N11 and N12 to shift in a direction toward a turn-OFF state thereof, and also increases the threshold voltage of these transistors due to the substrate effect, whereby the leakage current of target transistors N11 and N12 is reduced.

At the end of the standby mode, or during a mode shift from the standby mode to an active mode, the substrate-potential generation circuits 31 and 34 return the output potential thereof to VPERI and VSS levels, respectively. On the other hand, the source-potential generation circuits 32 and 33 return the output potential thereof to VPERI and VSS levels, respectively. At this stage, signal φ is controlled to shift from a H-level to a L-level, to thereby turn ON the potential equalizing transistors P21 and N21. The turn-ON of potential equalizing transistor P21 generates a current flowing from power source line 41 having a potential of (VPERI+ΔVbp) to power source line 42 having a potential of (VPERI−ΔVsp), whereby the potential of power source lines 41 and 42 returns toward original VPERI. Similarly, the turn-ON of potential equalizing transistor N21 generates a current flowing from power source line 43 having a potential of (VSS+ΔVsn) to power source line 44 having a potential of (VSS−ΔVbn), whereby the potential of power source line 43 and power source line 44 returns toward original VSS.

It is assumed here that Cbp and Csp are a total load capacitance of power source line 41 including an adjustable load capacitance and a total load capacitance of power source line 42, respectively. In this embodiment, the total load capacitances Cbp and Csp are adjusted to satisfy the following relationship:

$$\Delta Vbp \times Cbp = \Delta Vsp \times Csp \tag{1}$$

This configuration causes the direction of the charge transfer, i.e., the current flow, between power source line 41 and power source line 42 to shift the potential of power source lines 41 and 42 to the original potential VPERI.

Similarly, it is assumed here that Cbn and Csn are a total load capacitance of power source line 43 including an adjustable load capacitance and a total load capacitance of power source line 44, respectively. In this embodiment, the total load capacitances Cbn and Csn are adjusted to satisfy the following relationship:

$$\Delta Vsn \times Csn = \Delta Vbn \times Cbn \tag{2}$$

This configuration causes the direction of the charge transfer, i.e., the current flow, between power source line 43 and power source line 44 to shift the potential of power source lines 43 and 44 to the original potential VSS.

The present embodiment uses the potential equalizing transistors P21 and N21, which are turned ON during a mode shift from the standby mode to the active mode to couple together power source lines 41 and 42, and couple together power source lines 43 and 44. This allows the direction of the charge transfer between power source lines 41 and 42 as well as between power source lines 43 and 44 to resume the original power source potentials, and assists the function of the substrate-potential generation circuits 31 and 34 as well as the source-potential generation circuits 32 and 33, return the potential of power source lines toward the original power source potentials VPERI and VSS. Thus, the time interval needed for recovery of the original power source potentials VPERI and VSS during the mode shift from the standby mode to the active mode can be reduced. More specifically, the semiconductor device 10 of the present embodiment shifts at a higher speed from the standby mode to the active mode, thereby accelerating the operational speed of the semiconductor device during the mode shift.

In the present embodiment, during the mode shift wherein the potential of power source lines 41 and 42 and the potential of power source lines 43 and 44 return to original VPERI and VSS, respectively, the potential equalizing transistors P21 and N21 are turned ON, whereby the relationship between the potential of power source lines 42 and 44 and the potential of power source lines 41 and 43 does not pass a forward current across the p-n junction. For this reason, a latch up failure resulting from the relationship between the source potential and the substrate potential does not occur. In addition, if the total capacitances of power source lines 41, 42, 43 and 44 are adjusted to satisfy at least one of the equations (1) and (2), the direction and amount of charge transfer between these power source lines assist these power source lines to resume the original potentials. This allows the substrate-potential generation circuits 31 and 34 and source-potential generation circuits 32 and 33 to provide less current to the power source lines 41 to 44 during the mode shift from the standby mode to the active mode, whereby the operating current of the source- and substrate-potential generation circuits 31-34 can be reduced.

Figure 3:
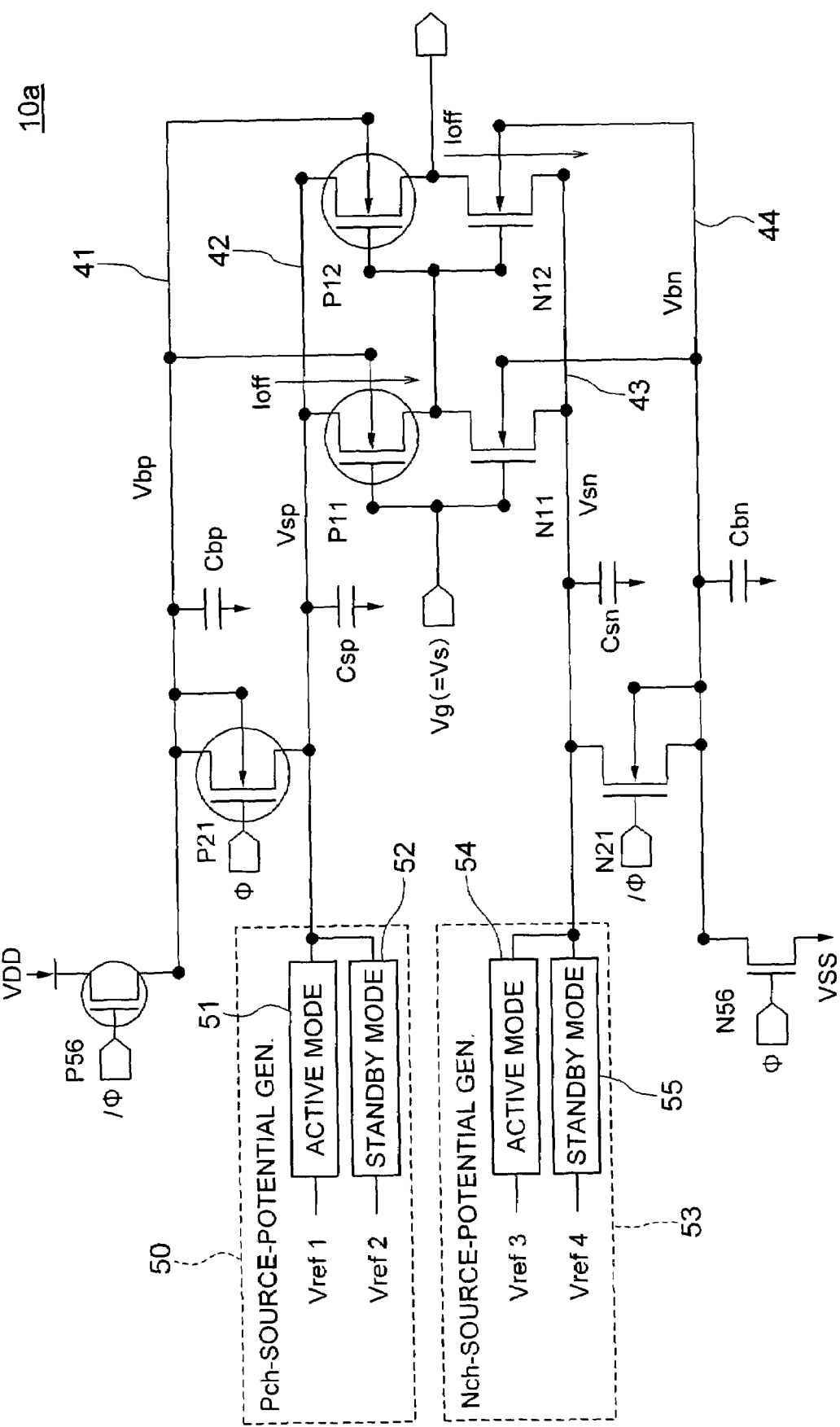
FIG. 3 is a circuit diagram of a semiconductor device according to a second embodiment of the present invention.

FIG. 3 shows the circuit configuration of a semiconductor device according to a second embodiment of the present invention. The semiconductor device, generally designated by numeral 10a, includes a high-potential-side source-potential generation circuit (Pch-source-potential generation circuit) 50 for generating a high-potential-side source potential (high source potential) and a low-potential-side source-potential generation circuit (Nch-source-potential generation circuit) 53 for generating a low-potential-side source potential (low source potential).

Pch-source-potential generation circuit 50 includes an active-mode source-potential generation circuit 51 for generating a high-potential-side source potential to be supplied to power source line 42 in an active mode, and a standby-mode source-potential generation circuit 52 for generating a high-potential source voltage to be supplied to power source line 42 in a standby mode. Nch-source-potential generation circuit 53 includes an active-mode source-potential generation circuit 54 for generating a low-potential source voltage to be supplied to power source line 43 in an active mode, and a standby-mode source-potential generation circuit 55 for generating a low-potential source voltage to be supplied to power source line 43 in a standby mode.

Power source line 41 is coupled to the high-potential-side external power source line VDD via a transistor P56. Transistor P56 corresponds to Pch-substrate-potential generation circuit 31 shown in FIG. 1. Transistor P56 supplies the external power source potential VDD to power source line 41, during a standby mode of the semiconductor device 10a controlled by signal φ. Power source line 44 is coupled to an external power source line VSS via transistor N56. Transistor N56 corresponds to Nch-substrate-potential generation circuit 34 shown in FIG. 1. Transistor N56 supplies the low-potential-side external power source potential VSS to power source line 44, during a standby mode of the semiconductor device 10a controlled by signal. When the semiconductor device 10a is in an active mode, power source lines 41 and 44 have a potential equal to the potential of power source lines 42 and 43, due to turn-ON of the potential equalizing transistors P21 and N21.

Figure 4:
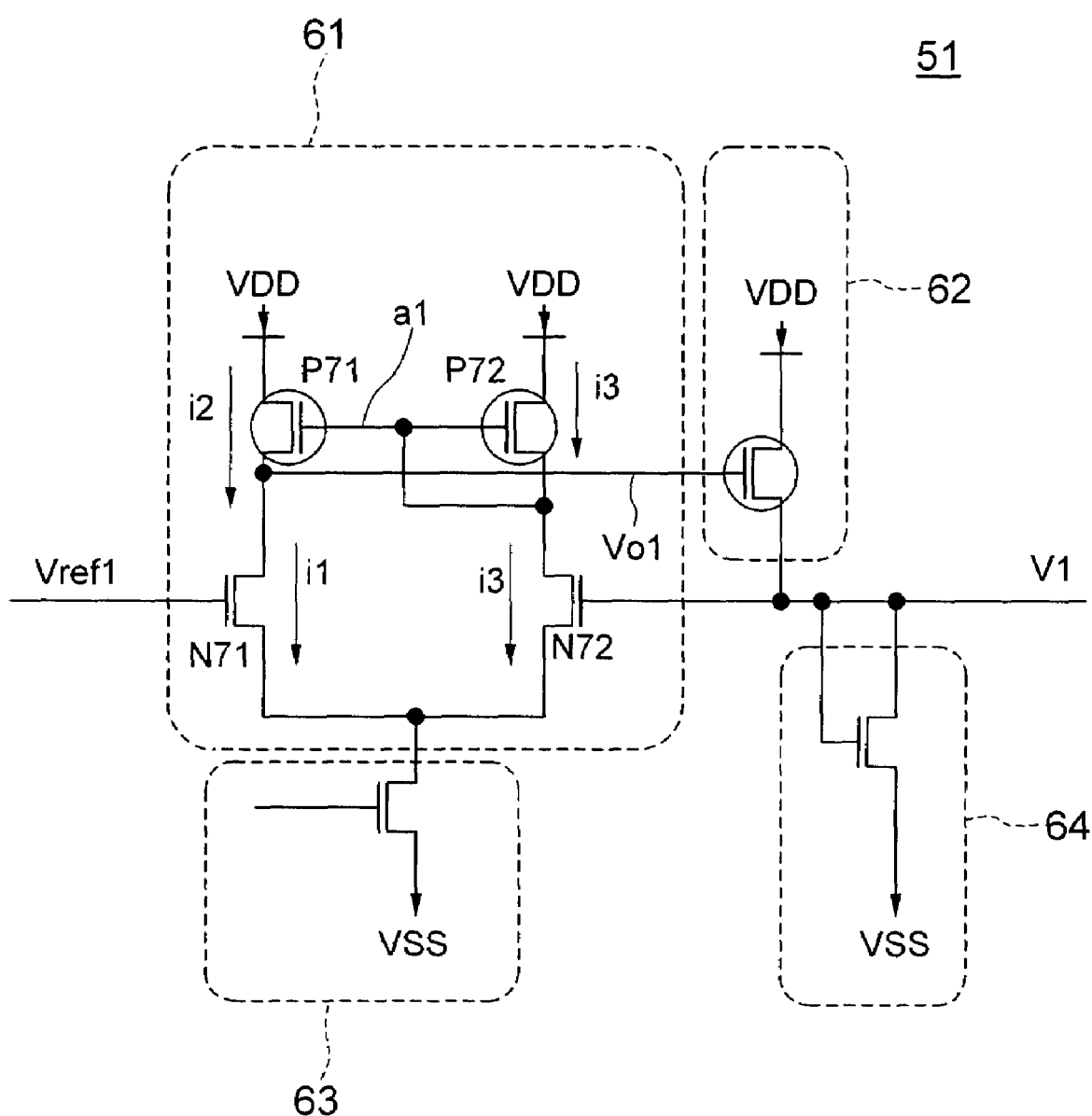
FIG. 4 is a circuit diagram of a source-potential generation circuit generating a high-potential source voltage in the second embodiment.

The configuration of the Pch-source-potential generation circuit 50 will be described hereinafter. FIG. 4 shows the circuit configuration of the active-mode source-potential generation circuit 51. The active-mode source-potential generation circuit 51 includes a current mirror 61, an output transistor 62, a switching transistor 63, and a discharge device 64. The current mirror 61 compares the output potential V1 against a reference potential Vref1, and outputs the result of comparison as an output potential Vo1 of the current mirror 61. The current i1 flowing through n-channel transistor N71 configuring the current mirror 61 is a constant current determined by reference potential Vref1. The gate (node a1) of p-channel transistor P71 assumes a potential determined by the current i3 flowing through transistors P72 and N72. The current i2 flowing through p-channel transistor 71 is proportional to the current i3 flowing through p-channel transistor P72. The output potential Vo1 of the current mirror 61 is determined by the relationship between the current i1 and the current i2. If the output potential V1 of the active-mode source-potential generation circuit 51 is lower than reference potential Vref1, then i1>i2, and if the output potential V1 is higher than reference potential Vref1, then i1<i2 to raise the output potential Vo1 of the current mirror 61.

The output transistor 62 includes a source connected to the external power source line VDD, and a drain connected to the output node V1 of the active-mode source-potential generation circuit 51. The gate of the output transistor 62 receives the output potential Vo1 of the current mirror 61, and controls the output potential V1 thereof based on the potential Vo1. The discharge device 64 is configured by a transistor including a source connected to an external power source line VSS, and a drain and a gate connected together to the output node V1. If the output potential V1 is higher than reference potential Vref1, the discharge device 64 passes a discharge current flowing toward the external power source line VSS from the output node V1, to adjust the output potential V1 equal to reference potential Vref1. The switching transistor 63 controls coupling between the current mirror 61 and the external power source line VSS. The switching transistor 63 blocks the current of current mirror 61 if the active-node source-potential generation circuit 51 is not used. The output potential V1 of the active-mode source-potential generation circuit 51 is supplied to the source of target transistors P11 and P12 and the source of P12 via power source line 42. Since the current is consumed by target transistors P11 and P12 from the output node V1, the active-mode source-potential generation circuit 51 acts for supplying a circuit in the active mode.

The circuit configuration of the standby-mode source-potential generation circuit 52 is similar to that of the active-mode source-potential generation circuit 51 shown in FIG. 4. A reference potential Vref2 which is lower than reference potential Vref1 is input to the current mirror 61 of the standby-mode source-potential generation circuit 52. If the semiconductor device 10a is in an active mode, the active-mode source-potential generation circuit 51 is activated, and the potential Vsp of power source line 42 is maintained at the potential generated based on reference potential Vref1, i.e., substantially equal to reference potential Vref2. If the semiconductor device 10a assumes a standby mode, the standby-mode source-potential generation circuit 52 is activated, and the potential Vsp of power source line 42 is maintained at the potential generated based on reference potential Vref2.

Figure 5:
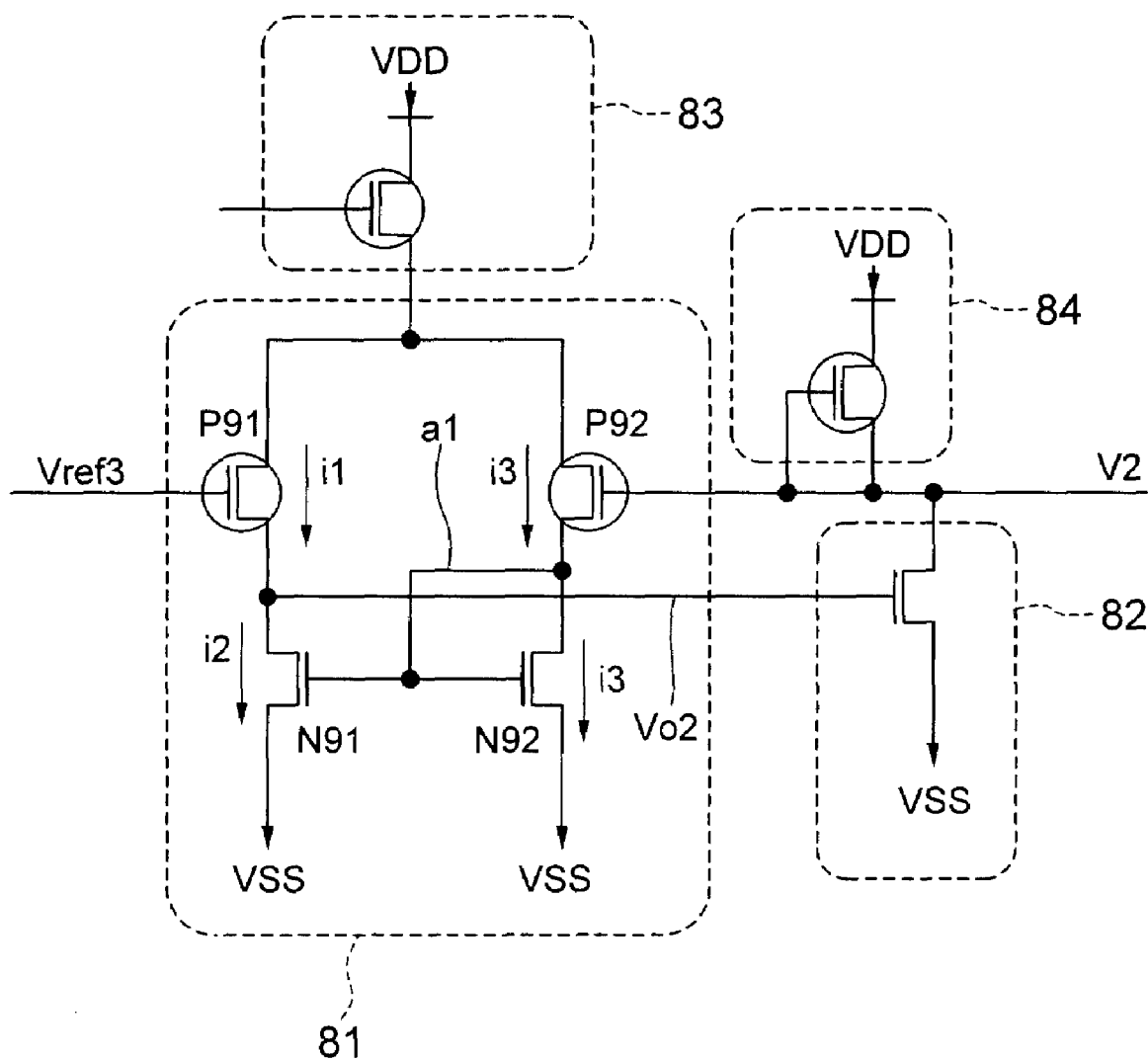
FIG. 5 is a circuit diagram of a source-potential generation circuit generating a low-potential source voltage in the second embodiment.

The circuit configuration of the Nch-source-potential generation circuit 53 will be described hereinafter. FIG. 5 shows active-mode source-potential generation circuit 54, which includes a current mirror 81, an output transistor 82, a switching transistor 83, and a charge device 84. Current mirror 81 compares output potential V2 against a reference potential Vref3, and outputs the result of comparison as an output potential Vo2. Current mirror 81 receives reference potential Vref3, which is lower than Vref1, on the gate of p-channel transistor P91. Current mirror 81 has a configuration and function similar to those of current mirror 61 shown in FIG. 4 as to the relationship between the currents flowing through transistors P91, N91, P92 and N92. More specifically, if the output potential V2 of active-mode source-potential generation circuit 54 is lower than reference potential Vref3, then i2>i1, and if the output potential V2 is higher than reference potential Vref3, then i2<i1 to raise the output potential Vo2 of the current mirror 81.

Output transistor 82 includes a source connected to the external power source line VSS, and drain connected to the output node V2. Output transistor 82 receives output potential Vo2 of current mirror 81 on the gate thereof, and controls the output potential V2 based on the potential Vo2. The charge device 84 includes a source connected to the external power source line VDD, and a drain and a gate connected together to the output node V2. If the output potential V2 is lower than reference potential Vref3, the charge device 84 passes a current flowing from the external power source line VDD toward the output node V2, to control the output potential V2 equal to reference potential Vref3. Switching transistor 83 controls coupling between current mirror 81 and the external power source line VDD. Switching transistor 83 blocks the current from current mirror 81 if active-mode source-potential generation circuit 54 is not used. The output node of active-mode source-potential generation circuit 54 is connected to the source of target transistors N11 and N12 via power source line 43. Since the target transistors N11 and N12 supply current from a node of the internal circuit to power source line 43, active-mode source-potential generation circuit 54 may be referred to as a discharge circuit.

Standby-mode source-potential generation circuit 55 has a configuration and a function similar to those of active-mode source-potential generation circuit 54 shown in FIG. 5. The current mirror 81 in the standby-mode source-potential generation circuit 55 receives reference potential Vref4. Reference potential Vref4 is higher than reference potential Vref3. If the semiconductor device 10a is in an active mode, active-mode source-potential generation circuit 54 is activated, and the potential Vsn of power source line 43 is maintained at the potential generated based on reference potential Vref3. If the semiconductor devices shifts to a standby mode, standby-mode source-potential generation circuit 55 is activated, and the potential Vsn of power source line 43 is maintained at the potential generated based on reference potential Vref4.

Figure 6:
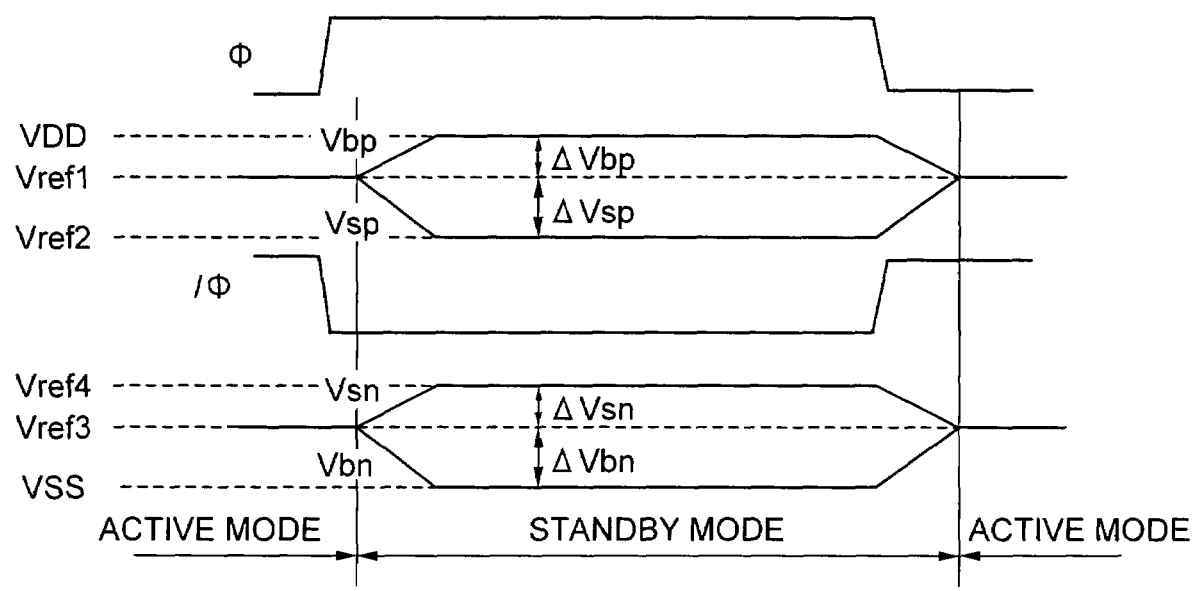
FIG. 6 is a timing chart showing the potential shift in the second embodiment.

FIG. 6 shows a waveform diagram of the potential of power source lines in the semiconductor device 10a. Signal φ is set at a L-level in the active mode, whereby the potential equalizing transistors P21 and N21 are turned ON, and transistors P56 and N56 are turned OFF. In the Pch-source-potential generation circuit 50, the active-mode source-potential generation circuit 51 is activated, and the potential Vsp of power source line 42 is maintained at the potential generated based on reference potential Vref1 which is lower than VDD. In the Nch-source-potential generation circuit 53, active-mode source-potential generation circuit 54 is activated, and the potential Vsn of power source line 43 is maintained at the potential generated based on reference potential Vref3 which is higher than VSS. At this stage, the switching transistors 63 and 83 (FIG. 4, FIG. 5) in the standby-mode source-potential generation circuits 52 and 55 are OFF, whereby the standby-mode source-potential generation circuits 52 and 55 are inactivated.

In the active mode, the potential equalizing transistor P21 is ON, whereby power source line 41 and power source line 42 are coupled together. Thus, the potential Vbp of power source line 41 is equal to the potential Vsp of power source line 42, i.e., equal to reference potential Vref1. The potential equalizing transistor N21 is ON, whereby the potential Vbn of power source line 44 is equal to the potential of power source line 43, i.e., the potential generated based on reference potential Vref3. Therefore, the source potential and substrate potential of target transistors P11 and P12 are equal to the potential generated based on reference potential Vref1, and the source potential and substrate potential of target transistors N11 and N12 are equal to the potential generated based on reference potential Vref3.

During the mode shift from the active mode to the standby mode, signal φ rises from a L-level to a H-level, whereby the potential equalizing transistors P21 and N21 are turned OFF, and transistors P56 and N56 are turned ON. The potential Vbp of power source line 41 shifts to the external power source potential VDD due to the turn-ON of transistor P56. The potential Vbn of power source line 44 shifts to the external power source potential VSS due to the turn-ON of transistor N56. In both the Pch- and Nch-source-potential generation circuits 50 and 53, the active-mode source-potential generation circuits 51 and 54 are inactivated, and the standby-mode source-potential generation circuits 52 and 55 are activated. The potential Vsp of power source line 42 falls due to the current passing through target transistors P11 and P12, to be maintained at the potential generated based on reference potential Vref2 by standby-mode source-potential generation circuit 52. The potential Vsn of power source line 43 rises due to the current flowing thereto via the target transistors N11 and N12, and is maintained at the potential generated based on reference potential Vref4 by standby-mode source-potential generation circuit 55.

During the mode shift from the standby mode to an active mode, signal φ falls from a H-level to a L-level, whereby transistors P56 and N56 are turned OFF, and the coupling between power source line 41 and the external power source line VDD and between power source line 44 and the external power source line VSS is cut off due to the L-level of signal φ. In addition, the potential equalizing transistors P21 and N21 are turned ON, whereby power source line 41 and power source line 42 as well as power source line 43 and power source line 44 are coupled together.

The turn-ON of the potential equalizing transistor P21 passes a current flowing from power source line 41 having a VDD potential toward power source line 42 having a potential determined based on reference potential Vref2, whereby the potential of power source line 41 falls, and the potential of power source line 42 rises. Thereafter, the potential of power source line 42 is maintained at the potential determined based on reference potential Vref1 by the active-mode source-potential generation circuit 51. Since power source line 41 and power source line 42 are coupled together at this stage, the potential of power source line 41 shifts to a potential equal to the potential of power source line 42, i.e., the potential generated based on reference potential Vref1.

The turn-ON of potential equalizing transistor N21 passes a potential equalizing current flowing from power source line 43 having a potential determined based on reference potential Vref4 to power source line 44 having a VSS potential, whereby the potential of power source line 43 falls and the potential of power source line 44 rises. Thereafter, the potential of power source line 43 is maintained at the potential determined based on reference potential Vref3 by active-mode source-potential generation circuit 54. Since power source line 43 and power source line 44 are coupled together at this stage, the potential of power source line 44 shifts to a potential equal to the potential of power source line 43, i.e., the potential generated based on reference potential Vref3.

It is assumed here that ΔVbp represents the difference between the potential of power source line 41 in the active mode and that in the standby mode, i.e., the difference between the external power source potential VDD and the potential determined based on reference potential Vref1. It is also assumed that ΔVsp represents the difference between the potential of power source line 42 in the active mode and that in the standby mode, i.e., the difference between the potential determined based on reference Vref1 and the potential determined based on reference potential Vref2. In this case, the design of the semiconductor device 10a is such that Cbp and Csp satisfy therebetween the formula (1), assuming that Cbp and Csp are the total load capacitance of power source line 41 including an adjustable load capacitance and the total load capacitance of power source line 42, respectively. The potential Vbp of power source line 41 and potential Vsp of power source line 42 change toward the potential determined based on reference potential Vref1 for the active mode, due to the transfer of electric charge from power source line 41 to power source line 42. After the potential of power source lines 41 and 42 equals to the potential based on reference potential Vref1, it is sufficient that the active-mode source-potential generation circuit 51 maintain the potential of power source lines 41 and 42 at the potential based on reference potential Vref1, whereby the operating current of source-potential generation circuit 51 needed for the mode shift from the standby mode to the active mode can be reduced.

It is assumed here that ΔVsn represents the difference between the potential of power source line 43 in the active mode and that in the standby mode, i.e., the difference between the potential based on reference potential Vref3 and the potential based on reference potential Vref4, and that ΔVbn represents the difference between the potential of power source line 44 in the active mode and that in the standby mode, i.e., the difference between the potential determined based on reference Vref3 and the external power source potential VSS. In this case, the design is such that Cbn and Csn satisfy therebetween the formula (2), assuming that Cbn and Csn are the total load capacitance of power source line 41 including an adjustable load capacitance and the total load capacitance of power source line 42, respectively. The potential Vsn of power source line 43 and potential Vbn of power source line 44 change toward the potential determined based on reference potential Vref3 for the active mode, due to the transfer of electric charge from power source line 43 to power source line 44. After the potential of power source lines 43 and 44 equals to the potential based on reference potential Vref3, it is sufficient that active-mode source-potential generation circuit 54 maintain the potential of power source lines 43 and 44 at the potential based on reference potential Vref3, whereby the operating current of source-potential generation circuit 54 needed for the mode shift from the standby mode to the active mode can be reduced.

In the first embodiment, power source line 44 is supplied with a potential lower than the external power source potential VSS in the standby mode. Since it is necessary to generate this potential by using a pump circuit, such as BBG (back bias generator), a periodic mode shift from the active mode to the standby mode, if occurs, may increase the operating current of the pump circuit and thus increases the power dissipation. In present embodiment, the potentials used in the semiconductor device 10a is in the range between the external power source potential VDD and the external power source potential VSS. This removes the necessity of using a pump circuit in the semiconductor device 10a, whereby the periodical mode shift does not significantly increase the power dissipation in the present embodiment. The other advantages in the present embodiment is similar to those in the first embodiment.

Figure 7:
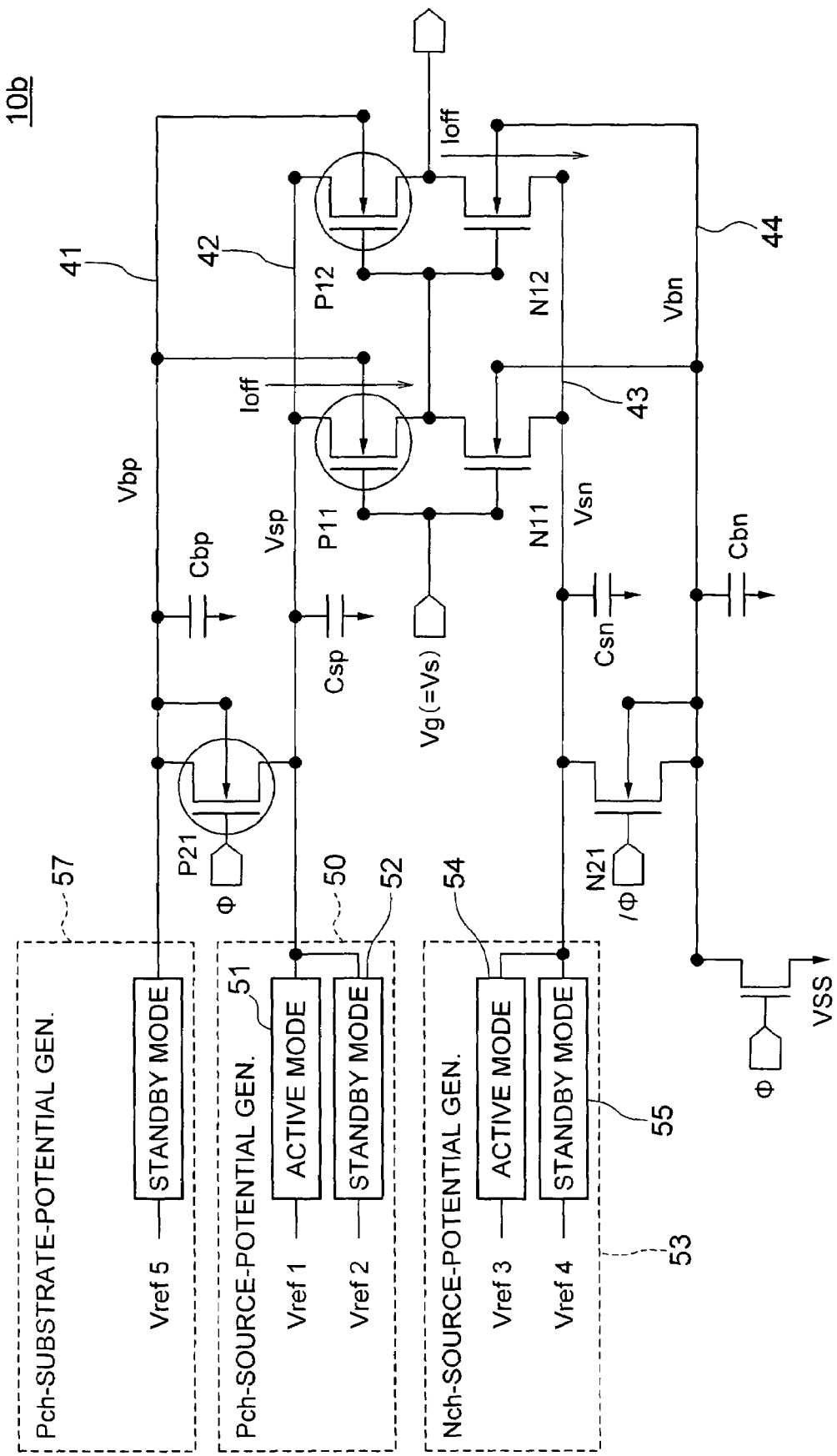
FIG. 7 is a circuit diagram of a semiconductor device according to a third embodiment of the present invention.

FIG. 7 shows the configuration of a semiconductor device according to a third embodiment of the present invention. The semiconductor device, generally designated by numeral 10b, is similar to the second embodiment except that the semiconductor device 10b includes a substrate-potential generation circuit 57 instead of transistor P56. Substrate-potential generation circuit 57 has a configuration similar to that of the active-mode source-potential generation circuit 51 in source-potential generation circuit 50 shown in FIG. 4. Substrate-potential generation circuit 57 maintains the potential of power source line 41 in the standby mode at the potential based on reference potential Vref5 obtained by lowering the external power source potential VDD. Reference potential Vref5 is higher than reference potential Vref1, and the potential of power source line 41 in the standby mode is higher than that in the active mode.

Figure 8:
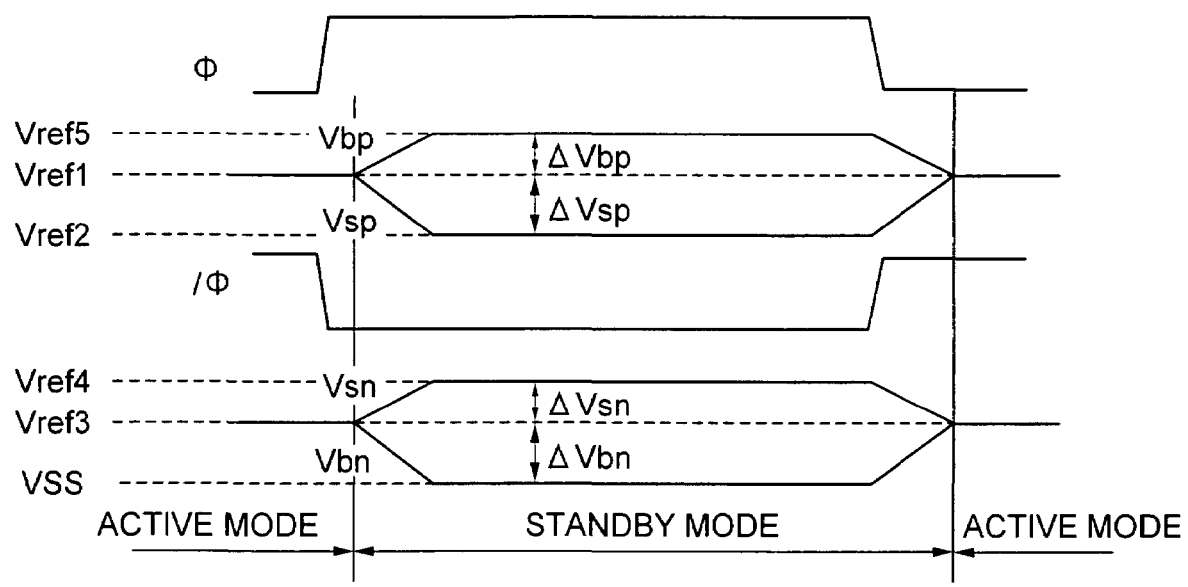
FIG. 8 is a timing chart showing the potential shift in the third embodiment.
Figure 9:
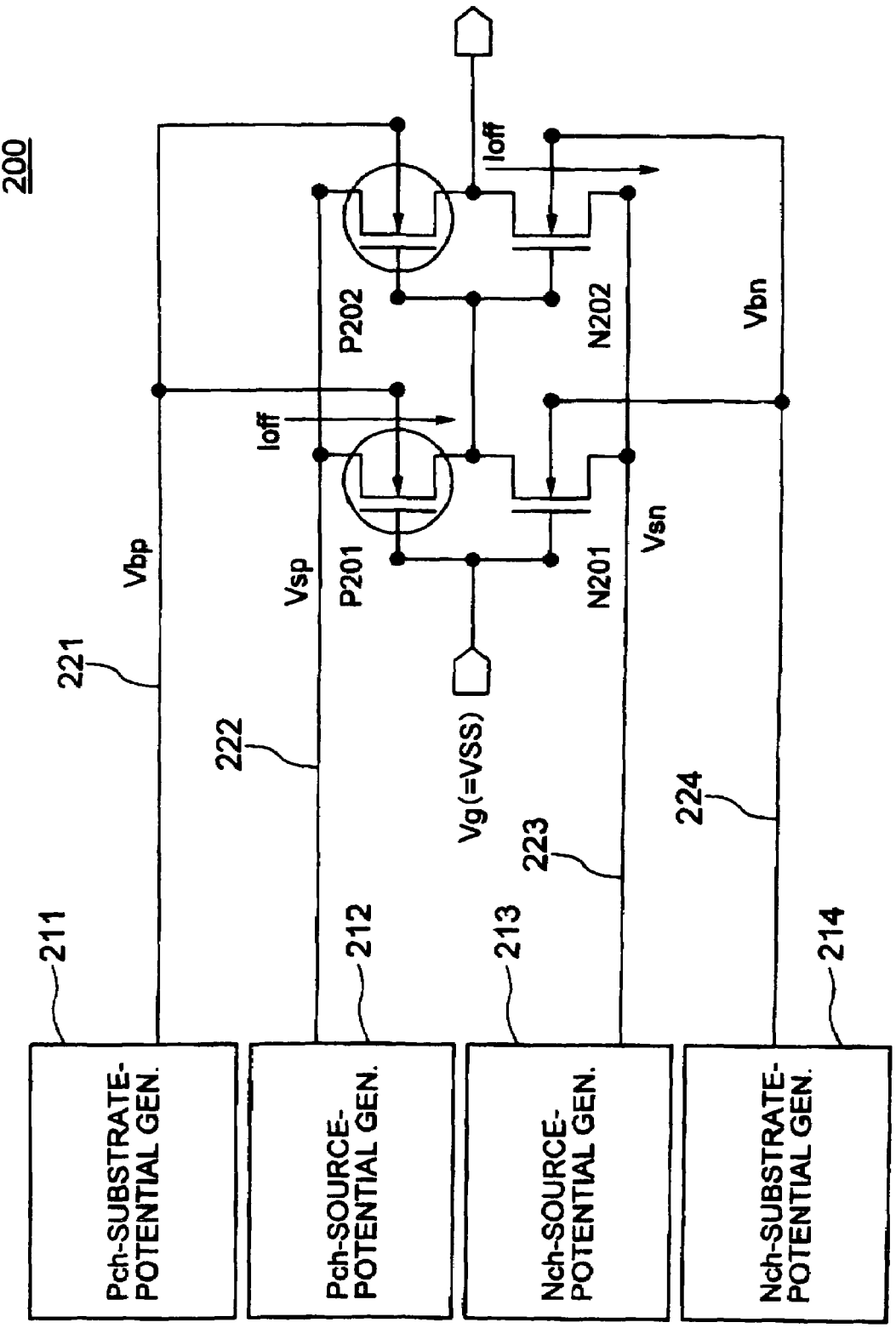
FIG. 9 is a circuit diagram of the semiconductor device described in a patent publication.
Figure 10:
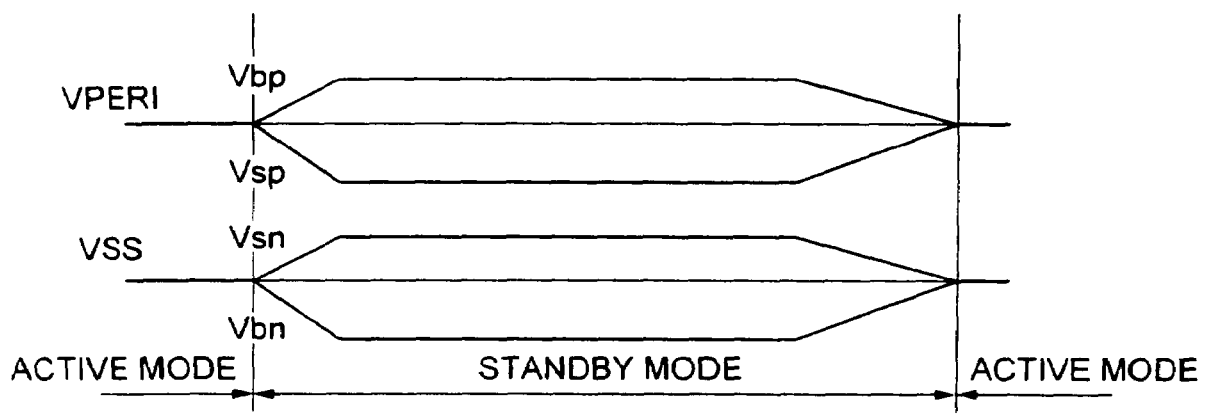
FIG. 10 is a timing chart showing the potential of the power source lines in the semiconductor device of FIG. 9.

FIG. 8 shows a timing chart showing the potential of power source lines in the semiconductor device 10b. In the active mode, the potential equalizing transistors P21 and N21 are ON, whereby the potentials of power source lines 41 and 42 as well as the potentials of power source lines 43 and 44 are maintained at the potential based on reference potential Vref1 and the potential based on reference potential Vref3, respectively. If the semiconductor device assumes a standby mode, the potential equalizing transistor P21 is turned OFF, the potential Vbp of power source line 41 shifts to the potential generated based on reference potential Vref5 by substrate-potential generation circuit 57, and the potential Vsp of power source line 42 shifts to the potential based on reference potential Vref2. The potential equalizing transistor N21 is turned OFF, the potential Vsn of power source line 43 shifts to the potential based on reference potential Vref4, and the potential Vbn of power source line 44 shifts to the external power source potential VSS.

When signal φ falls from a H-level to a L-level during the mode shift from the standby mode to the active mode, the potential equalizing transistors P21 and N21 are turned ON, whereby power source lines 41 and 42 as well as power source lines 43 and 44 are coupled together. The current flows from power source line 41 to power source line 42, and from power source line 43 to power source line 44. Thus, potential of power source lines 41 and 43 is lowered from the potential in the standby mode, whereas the potential of power source lines 42 and 44 rises from the potential in the standby mode. In the source-potential generation circuits 50 and 53, the active-mode source-potential generation circuits 51 and 54 are activated, whereby the potential of power source lines 41 and 42 shifts to and is maintained at the potential based on reference potential Vref1, and the potential of power source lines 43 and 44 shifts to and is maintained at the potential based on reference potential Vref3.

In the present embodiment, the substrate-potential generation circuit 57 generates the potential of power source line 41 in the standby mode, by lowering the external power source potential VDD. In this case, since the potentials used in the semiconductor device 10b are within the range between the external power source potentials VDD and VSS, as in the case of the second embodiment, a pump circuit is not needed in the semiconductor device. Thus, an increase in the power dissipation can be suppressed.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A semiconductor device comprising:
   a target transistor operating in either an active mode or a standby mode;
   a substrate-potential power source line and a source-potential power source line for providing a substrate potential and a source potential, respectively, to said target transistor; and
   a potential equalizing transistor for controlling coupling between said substrate-potential power source line and said source-potential power source line, wherein:
   said potential equalizing transistor is OFF, and different potentials are supplied to said substrate-potential power source line and said source-potential power source line in said standby mode;
   said potential equalizing transistor is turned ON during a mode shift from said standby mode to said active mode;
   a common potential is supplied to said substrate-potential power source line and said source-potential power source line in said active mode;
   a source-potential generation circuit for generating said common potential and a first potential supplied to said source-potential power source line in said active mode and said standby mode, respectively; and
   a substrate-potential generation circuit for generating a second potential supplied to said substrate-potential power source line in said standby mode, said first and second potentials providing a specific potential difference between said substrate-potential power source line and said source-potential power source line in said standby mode,
   wherein said source-potential power source line and said substrate-potential power source line include a high-source-potential power source line and a high-substrate-potential power source line, said source-potential generation circuit and said substrate-potential generation circuit include a high-source-potential generation circuit and a high-substrate-potential substrate potential, respectively, which supply a high-potential-side source potential and a high-potential-side substrate potential to said high-source-potential power source line and said high-substrate-potential power source line, respectively,
   wherein the following relationship holds:

$$\Delta Vbp \times Cbp = \Delta Vsp \times Csp,$$

wherein $\Delta Vbp$, $\Delta Vsp$, $Cbp$ and $Csp$ are a difference between said second potential and said common potential, a difference between said common potential and said first potential, a load capacitance of said high-substrate-potential power source line, and a load capacitance of said high-source-potential power source line, respectively.

2. The semiconductor device according to claim 1, wherein said source-potential generation circuit includes an active-mode source-potential generation circuit activated in said active mode for generating said common potential based on a first reference potential, and a standby-mode source-potential generation circuit activated in said standby-mode for generating said first potential based on a second reference potential.

3. The semiconductor device according to claim 1, wherein said high-source-potential generation circuit supplies to said high-source-potential power source line a first source potential in said standby mode lower than a second source potential supplied thereto in said active mode.

4. The semiconductor device according to claim 3, wherein said high-substrate-potential generation circuit supplies to said high-substrate-potential power source line a first substrate potential in said standby mode higher than said second source potential.

5. The semiconductor device according to claim 4, wherein said first substrate potential is not higher than an external high-potential-side power source potential supplied to said semiconductor device.

6. The semiconductor device according to claim 4, wherein said high-source-potential generation circuit supplies said second source potential to said high-substrate-potential power source line via said equalizing transistor in said active mode.

7. The semiconductor device according to claim 4, wherein said high-substrate-potential generation circuit supplies to said high-substrate-potential power source line a second substrate potential equal to said second source potential.

8. The semiconductor device according to claim 1 wherein said source-potential power source line and said substrate-potential power source line include a low-source-potential power source line and a low-substrate-potential power source line, said source-potential generation circuit and said substrate-potential generation circuit include a low-source-potential generation circuit and a low-substrate-potential substrate potential, respectively, which supply a low-potential-side source potential and a low-potential-side substrate potential to said low-source-potential power source line and said low-substrate-potential power source line, respectively.

9. A semiconductor device comprising:
   a target transistor operating in either an active mode or a standby mode;
   a substrate-potential power source line and a source-potential power source line for providing a substrate potential and a source potential, respectively, to said target transistor; and
   a potential equalizing transistor for controlling coupling between said substrate-potential power source line and said source-potential power source line, wherein:
   said potential equalizing transistor is OFF, and different potentials are supplied to said substrate-potential power source line and said source-potential power source line in said standby mode;
   said potential equalizing transistor is turned ON during a mode shift from said standby mode to said active mode;
   a common potential is supplied to said substrate-potential power source line and said source-potential power source line in said active mode;
   a source-potential generation circuit for generating said common potential and a first potential supplied to said source-potential power source line in said active mode and said standby mode, respectively; and
   a substrate-potential generation circuit for generating a second potential supplied to said substrate-potential power source line in said standby mode, said first and second potentials providing a specific potential difference between said substrate-potential power source line and said source-potential power source line in said standby mode,
   wherein said source-potential power source line and said substrate-potential power source line include a low-source-potential power source line and a low-substrate-potential power source line, said source-potential generation circuit and said substrate-potential generation circuit include a low-source-potential generation circuit and a low-substrate-potential substrate potential, respectively, which supply a low-potential-side source potential and a low-potential-side substrate potential to said low-source-potential power source line and said low-substrate-potential power source line, respectively, wherein the following relationship holds:

$$\Delta Vsn \times Csn = \Delta Vbn \times Cbn,$$

wherein $\Delta Vbn$, $\Delta Vsn$, $Cbn$, and $Csn$ are a difference between said common potential and said second potential, a difference between said first potential and said common potential, a load capacitance of said low-source-potential power source line, and a load capacitance of said low-substrate-potential power source line, respectively.

10. The semiconductor device according to claim 9, wherein said low-source-potential generation circuit supplies to said low-source-potential power source line a first source potential in said standby mode higher than a second source potential supplied thereto in said active mode.

11. The semiconductor device according to claim 10, wherein said low-substrate-potential generation circuit supplies to said low-substrate-potential power source line a first substrate potential in said standby mode lower than said second source potential.

12. The semiconductor device according to claim 11, wherein said first substrate potential is equal to an external low-potential-side power source potential supplied to said semiconductor device.

13. The semiconductor device according to claim 11, wherein said low-source-potential generation circuit supplies said second source potential to said low-substrate-potential power source line via said potential equalizing transistor in said active mode.

14. The semiconductor device according to claim 11, wherein said low-substrate-potential generation circuit supplies to said low-substrate-potential power source line a second substrate potential equal to said second source potential.

* * * * *